United States Patent
Li et al.

(10) Patent No.: US 10,870,752 B2
(45) Date of Patent: Dec. 22, 2020

(54) PIXEL DEFINING LAYER AND PREPARATION MATERIAL THEREOF, AND DISPLAY SUBSTRATE AND PREPARATION METHOD THEREOF

(71) Applicants: Hefei Xinsheng Optoelectronics Technology Co., Ltd., Anhui (CN); BOE Technology Group Co., Ltd., Beijing (CN)

(72) Inventors: Wei Li, Beijing (CN); Jingjing Xia, Beijing (CN); Bin Zhou, Beijing (CN); Dongfang Wang, Beijing (CN); Ce Zhao, Beijing (CN); Yingbin Hu, Beijing (CN); Wei Song, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/452,773

(22) Filed: Jun. 26, 2019

(65) Prior Publication Data

US 2020/0056033 A1 Feb. 20, 2020

(30) Foreign Application Priority Data

Aug. 17, 2018 (CN) .......................... 2018 1 0943500

(51) Int. Cl.
| | | |
|---|---|---|
| *H01L 29/08* | (2006.01) | |
| *C08F 2/46* | (2006.01) | |
| *C08F 2/50* | (2006.01) | |
| *C08G 61/04* | (2006.01) | |
| *C08L 33/12* | (2006.01) | |
| *C08F 220/28* | (2006.01) | |
| *C08F 220/34* | (2006.01) | |
| *C08F 292/00* | (2006.01) | |
| *C08K 3/22* | (2006.01) | |
| *C08K 5/08* | (2006.01) | |
| *C08K 5/32* | (2006.01) | |
| *C08L 33/16* | (2006.01) | |
| *H01L 27/32* | (2006.01) | |
| *C08K 5/06* | (2006.01) | |
| *C08K 5/13* | (2006.01) | |
| *C08L 83/04* | (2006.01) | |

(52) U.S. Cl.
CPC ............ *C08L 33/12* (2013.01); *C08F 220/28* (2013.01); *C08F 220/34* (2013.01); *C08F 292/00* (2013.01); *C08K 3/22* (2013.01); *C08K 5/08* (2013.01); *C08K 5/32* (2013.01); *C08L 33/16* (2013.01); *H01L 27/3246* (2013.01); *C08F 220/343* (2020.02); *C08K 5/06* (2013.01); *C08K 5/13* (2013.01); *C08K 2003/2272* (2013.01); *C08K 2201/005* (2013.01); *C08K 2201/01* (2013.01); *C08L 83/04* (2013.01); *C08L 2203/206* (2013.01); *C08L 2205/02* (2013.01)

(58) Field of Classification Search
CPC .......... C08L 2205/02; C08L 2203/206; C08L 33/12; C08L 33/16; C08L 23/16; C08L 83/04; H01L 27/3246; C08K 2003/2272; C08K 5/08; C08K 5/06; C08K 5/32; C08K 5/18; C08K 5/07; C08K 5/13; C08K 3/22; C08K 2201/005; C08K 2201/011; C08K 2201/01; C08F 220/34; C08F 220/28; C08F 220/343; C08F 292/00; C08F 2220/343
USPC .......... 257/40; 522/6, 71, 189, 184, 1; 520/1
See application file for complete search history.

(56) References Cited

U.S. PATENT DOCUMENTS

| | | |
|---|---|---|
| 2014/0153079 A1 | 6/2014 | Hsieh |
| 2019/0148468 A1 | 5/2019 | Jia et al. |
| 2019/0181195 A1 | 6/2019 | Wang et al. |

FOREIGN PATENT DOCUMENTS

| | | | |
|---|---|---|---|
| CN | 1454924 A | 11/2003 | |
| CN | 101037205 A | 9/2007 | |
| CN | 101157745 A | 4/2008 | |
| CN | 102336972 A | 2/2012 | |
| CN | 105126716 A | 12/2015 | |
| CN | 107887423 A | 4/2018 | |
| CN | 108091580 A | 5/2018 | |
| CN | 108107625 A | 6/2018 | |
| CN | 108198845 A | 6/2018 | |
| WO | WO-2019205594 A1 * | 10/2019 | ................ G03F 7/11 |

OTHER PUBLICATIONS

First office action of Chinese application No. 201810943500.7 dated Apr. 15, 2020.

* cited by examiner

*Primary Examiner* — Jessica Whiteley
(74) *Attorney, Agent, or Firm* — Fay Sharpe LLP

(57) ABSTRACT

The present disclosure provides a pixel defining layer and a preparation material thereof, and a display substrate and a preparation method thereof, and relates to the field of display technologies. The preparation material of the pixel defining layer comprises the following components in mass percentages: 5%-30% of a lyophobic film-forming polymer, 0.5%-1% of lyophilic magnetic nanoparticles, 0.5%-2% of a photoinitiator, 0.1%-1% of a reactive monomer, 0.1%-1% of an additive and the balance of a solvent.

20 Claims, 2 Drawing Sheets

PIXEL DEFINING LAYER AND PREPARATION MATERIAL THEREOF, AND DISPLAY SUBSTRATE AND PREPARATION METHOD THEREOF

CROSS-REFERENCE TO RELATED APPLICATION

This application claims priority to Chinese Patent Application No. 201810943500.7, filed on Aug. 17, 2018 and entitled "PIXEL DEFINING LAYER AND PREPARATION MATERIAL AND PREPARATION METHOD THEREOF, AND DISPLAY SUBSTRATE," the entire contents of which are incorporated herein by reference.

TECHNICAL FIELD

The present disclosure relates to display technologies, and in particular, to a pixel defining layer and preparation material thereof, and display substrate and preparation method thereof.

BACKGROUND

For the preparation of a display device such as an organic light-emitting diode (OLED) and a liquid crystal display (LCD), etc., a wet film-forming process such as inkjet printing process is generally used. In the inkjet printing process, the organic solution is printed in a pixel region defined by a pixel defining layer and then dried to form a pixel layer. On the one hand, in order to avoid the organic solution spreading on the top of the pixel region to contaminate adjacent pixels, it is desirable that the upper portion of the pixel defining layer is lyophobic; and on the other hand, in order to enable the organic solution to uniformly spread on the bottom of the pixel region to form a pixel layer having a uniform thickness, it is desirable that the bottom portion of the pixel defining layer is lyophilic.

At present, in order to obtain the above-mentioned pixel defining layer which changes from the top portion being lyophobic to the bottom portion being lyophilic, when preparing the pixel defining layer, the lower half thereof is prepared by using a lyophilic material, and the upper half thereof is prepared by using a lyophobic material, and the lower half and the upper half are respectively patterned to form a pixel region.

SUMMARY

In view of this, the present disclosure provides a pixel defining layer and a preparation material thereof, and a display substrate and a preparation method thereof, which can solve the above technical problems. The following technical solutions are included.

On an aspect, a preparation material of a pixel defining layer is provided, the preparation material comprising the following components in mass percentages: 5%-30% of a lyophobic film-forming polymer, 0.5%-1% of lyophilic magnetic nanoparticles, 0.5%-2% of a photoinitiator, 0.1%-1% of a reactive monomer, 0.1%-1% of an additive and a balance of solvent.

In one possible implementation, the lyophobic film-forming polymer comprises a fluoropolymer.

In one possible implementation, the fluoropolymer comprises a fluorine-containing acrylic polymer.

In one possible implementation, the fluorine-containing acrylic polymer comprises a copolymer of methyl methacrylate (MMA) and dodecafluoroheptyl methacrylate.

In one possible implementation, the mass percentage of methyl methacrylate in the copolymer of methyl methacrylate (MMA) and dodecafluoroheptyl methacrylate is between 85%-95%, and the balance is dodecafluoroheptyl methacrylate.

In one possible implementation, the photoinitiator comprises at least one of nitroaniline, anthraquinone, benzophenone, and N-acetyl-4-nitro-naphthylamine.

In one possible implementation, the reactive monomer comprises at least one of dipentaerythritol pentaacrylate, dipentaerythritol hexaacrylate, urethane acrylate, and ethoxylated pentaerythritol tetraacrylate.

In one possible implementation, the additive comprises at least one of a polymerization inhibitor, a leveling agent, an antifoaming agent, and a stabilizer.

In one possible implementation, the polymerization inhibitor comprises any one of hydroquinone, 2-sec-butyl-4,6-dinitrophenol, p-tert-butylcatechol and 2,5-di-tert-butylhydroquinone.

In one possible implementation, the leveling agent comprises any one of acrylic compound, organosilicon compound and fluorocarbon compound.

In one possible implementation, the antifoaming agent comprises at least one of emulsifying silicon oil, higher alcohol fatly acid ester complex, polyoxyethylene polyoxypropylene pentaerythritol ether, polyoxyethylene polyoxypropylene ether, polyoxypropylene glyceryl ether, polyoxypropylene polyoxyethylene glyceryl ether, and polydimethylsiloxane.

In one possible implementation, the stabilizer comprises at least one of isoamyl alcohol, n-hexanol, glycerol and n-hexane.

In one possible implementation, the solvent comprises at least one of N-methylpyrrolidone, glycol ether, ethylene glycol alkyl ether acetate, diethylene glycol, propylene glycol monomethyl ether acetate, ethyl ethoxyacetate, dimethoxyacetaldehyde, propylene glycol methyl ether acetate, ethyl 3-ethoxypropionate, propylene glycol monomethyl ether PM, and ethylene glycol ethyl ether acetate.

In one possible implementation, the lyophilic magnetic nanoparticles comprise: magnetic nanoparticles, a coupling agent coated on the outside of the magnetic nanoparticles, and a lyophilic polymer grafted onto the surface of the coupling agent.

In one possible implementation, the magnetic nanoparticles comprise ferroferric oxide nanoparticles;
the coupling agent comprises silicon dioxide; and
the lyophilic polymer comprises poly(methyl methacrylate-ethylene glycol methyl ether methacrylate).

On another aspect, a preparation method of a pixel defining layer is provided. And the preparation method comprises: providing an underlay substrate;
coating the preparation material of the pixel defining layer described above on the underlay substrate to form a wet film;
removing solvent in the wet film, and inducing the lyophilic magnetic nanoparticles in the wet film to migrate toward the side close to the underlay substrate by an external magnetic field to obtain a transition film layer; and
patterning the transition film layer to obtain the pixel defining layer.

In one possible implementation, the external magnetic field is an electromagnet located below the underlay substrate.

In one possible implementation, the distribution of the lyophilic magnetic nanoparticles in the pixel defining layer is controlled by adjusting at least one of the following operating conditions:

the magnetic field strength of the external magnetic field, the time of action of the external magnetic field, and the mass concentration of the lyophilic magnetic nanoparticles.

On further aspect, a pixel defining layer is provided by the embodiments of the present disclosure. The pixel defining layer is prepared by the preparation method of the pixel defining layer described above.

In one possible implementation, the pixel defining layer comprises a defining layer body, and lyophilic magnetic nanoparticles doped in a lower portion of the defining layer body;

wherein the defining layer body is prepared by polymerizing a lyophobic film-forming polymer and a reactive monomer in a solvent under the action of a photoinitiator, and is doped with an additive.

On a further aspect, a display substrate is provided by the embodiments of the present disclosure. The display substrate comprises an underlay substrate, the pixel defining layer disposed on the underlay substrate described above, and a pixel layer disposed in a pixel region defined by the pixel defining layer.

On a further aspect, a preparation method of a display substrate is provided by the embodiments of the present disclosure. The method comprises: providing an underlay substrate; forming a pixel defining layer on the underlay substrate according to the preparation method of the pixel defining layer described above;

filling a pixel layer material solution into a pixel region defined by the pixel defining layer, and drying to obtain a cured pixel layer.

The beneficial effects of the technical solution provided by the embodiments of the present disclosure include at least the following.

The preparation material of the pixel defining layer provided by the embodiments of the present disclosure can form a pixel defining layer which gradiently changes from the top portion being lyophobic to the bottom portion being lyophilic through a synergy among the components in the proportions described above. Thus, on the one hand, the pixel material solution can be effectively avoided spreading on the top of the pixel region to contaminate adjacent pixel, and on the other hand, the pixel material solution can uniformly spread on the bottom of the pixel region to form a pixel layer having a uniform thickness. Wherein, the lyophobic film-forming polymer and the reactive monomer are polymerized in the solvent under the action of the photoinitiator, so that a lyophobic defining layer body of the pixel defining layer can be prepared; and the additive is uniformly doped in a defining layer body to impart desired properties such as surface smoothness to the defining layer body. During the preparation process, the lyophilic magnetic nanoparticles can be induced to the lower portion of the defining layer body by an external magnetic field to impart lyophilicity to the lower portion of the defining layer body, thereby obtaining a pixel defining layer which changes from the upper portion being lyophobic to the lower portion being lyophilic, which effectively simplifies the preparation process.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art can also derive other drawings from these accompanying drawings without creative efforts.

DETAILED DESCRIPTION

Figure 1:
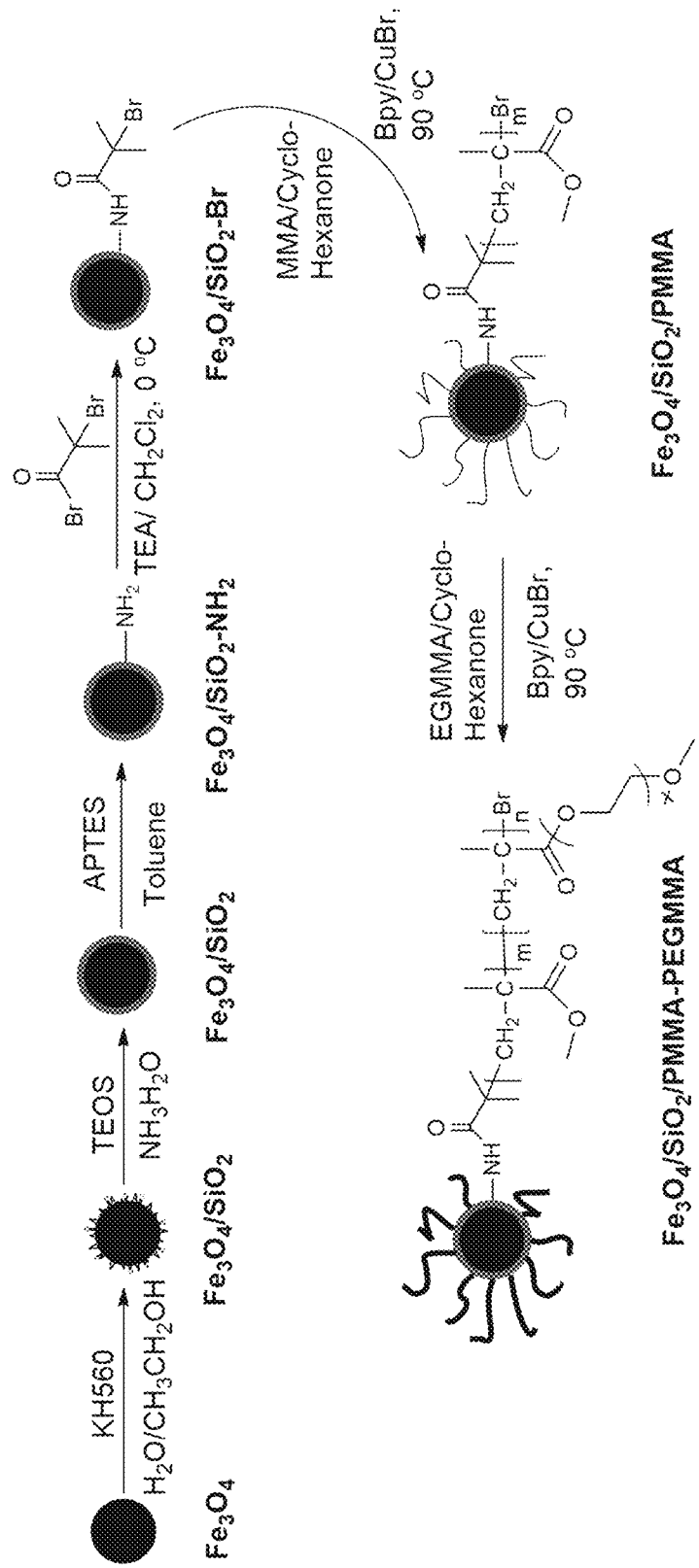
FIG. 1 is a flow chart of preparation of a lyophilic magnetic nanoparticles provided by the embodiments of the present disclosure.

To present the technical solutions and advantages of the present disclosure more clearly, embodiments of the present disclosure will be described in further detail in combination with the accompanying drawings.

It should be noted that, in a display device, a pixel defining layer includes: a defining region (also referred to as a Bank region), and a pixel region (also referred to as a pixel opening region) defined by the defining region. Wherein, the defining region is directly formed by the pixel defining layer. In order to solve the problems of complex process and material limitation, etc., as a result that during the process of preparing a pixel defining layer, it is necessary to use two or more kinds of preparation materials which are lyophilic and lyophobic and to perform multiple times of patterning process, the embodiments of the present disclosure provide a preparation material that can be used to prepare a pixel defining layer which changes from the upper portion being lyophobic to the lower portion being lyophilic.

Wherein, according to the embodiments of the present disclosure, the upper or top portion of the pixel defining layer refers to the side of the pixel defining layer away from the underlay substrate, and the lower or bottom portion of the pixel defining layer refers to the side of the pixel defining layer close to the underlay substrate.

In one aspect, the embodiments of the present disclosure provide a preparation material of a pixel defining layer, which includes the following components in mass percentages: 5%-30% of lyophobic film-forming polymer, 0.5%-1% of lyophilic magnetic nanoparticles, 0.5%-2% of photoinitiator, 0.1%-1% of reactive monomer, 0.1%-1% of additive and a balance of solvent.

The preparation material of the pixel defining layer provided by the embodiments of the present disclosure can form a pixel defining layer which gradiently changes from the top portion being lyophobic to the bottom portion being lyophilic through a synergy among the components in the proportions described above. Thus, on the one hand, the pixel material solution can be effectively avoided spreading on the top of the pixel region to contaminate adjacent pixel, and on the other hand, the pixel material solution can uniformly spread on the bottom of the pixel region to form a pixel layer having a uniform thickness. Wherein, the lyophobic film-forming polymer and the reactive monomer are polymerized in the solvent under the action of the photoinitiator, so that a lyophobic defining layer body of the pixel defining layer can be prepared; and the additive is uniformly doped in a defining layer body to impart desired properties such as surface smoothness to the defining layer body. During the preparation process, the lyophilic magnetic nanoparticles can be induced to the lower portion of the defining layer body by an external magnetic field to impart lyophilicity to the lower portion of the defining layer body, thereby obtaining a pixel defining layer which changes from the upper portion being lyophobic to the lower portion being lyophilic, which effectively simplifies the preparation process, improves the film-forming uniformity of the pixel defining layer, and improves the display effect and product quality of the display device prepared through the pixel defining layer.

For each of the components in the preparation material of the pixel defining layer, the mass proportions thereof are set to at least satisfy the following conditions: the formed pixel defining layer has a desired defining function; the formed pixel defining layer does not affect the light-emitting performance of the display device; and the formed pixel defining layer satisfies the requirement that which gradiently changes from the top portion being lyophobic to the bottom portion being lyophilic.

By way of example, the mass percentage of the lyophobic film-forming polymer can include: 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29% or 30%, etc.

The mass percentage of the lyophilic magnetic nanoparticles can include: 0.5%, 0.6%, 0.7%, 0.8%, 0.9% or 1%, etc.

The mass percentage of the photoinitiator can include: 0.5%, 0.6%, 0.7%, 0.8%, 0.9%, 1.0%, 1.1%, 1.2%, 1.3%, 1.4%, 1.5%, 1.6%, 1.7%, or 1.8%, etc.

The mass percentage of the reactive monomer can include: 0.1%, 0.2%, 0.3%, 0.4%, 0.5%, 0.6%, 0.7%, 0.8%, 0.9% or 1%, etc.

The mass percentage of the additive can include: 0.1%, 0.2%, 0.3%, 0.4%, 0.5%, 0.6%, 0.7%, 0.8%, 0.9% or 1%, etc.

In one possible implementation, the preparation material of the pixel defining layer includes the following components in mass percentages: 10%-20% of the lyophobic film-forming polymer, 0.8%-1% of the lyophilic magnetic nanoparticles, 0.8%-1.5% of the photoinitiator, 0.1%-0.5% of the reactive monomer, 0.1%-0.5% of the additive and the balance of solvent.

In another possible implementation, the preparation material of the pixel defining layer includes the following components in mass percentages: 5%-15% of the lyophobic film-forming polymer, 0.5%-0.9% of the lyophilic magnetic nanoparticles, 0.5%4% of a photoinitiator, 0.5%-1% of the reactive monomer, 0.5%-1% of the additive and the balance of solvent.

For the lyophobic film-forming polymer, it is used to form a lyophobic matrix of the pixel defining layer. The lyophobic film-forming polymer includes a fluoropolymer, and further, the fluoropolymer can include a fluorine-containing acrylic polymer. By way of example, the fluorine-containing acrylic polymer can include a copolymer of methyl methacrylate (MMA) and dodecafluoroheptyl methacrylate. And the copolymer of methyl methacrylate (MMA) and dodecafluoroheptyl methacrylate also can be called as poly(methyl methacrylate-dodecafluoroheptyl methacrylate). Wherein, the mass percentage of methyl methacrylate in poly(methyl methacrylate-dodecafluoroheptyl methacrylate) can be between 85%-95%, for example 90%, and the balance is dodecafluoroheptyl methacrylate.

For the photoinitiator, it is used to initiate polymerization and cross-linking of the reactive monomer under illumination conditions, and then to cooperate with the lyophobic film-forming polymer to form the defining layer body of the pixel defining layer after curing. As an example, the photoinitiator includes any one of or a combination of more than one of nitroaniline, anthraquinone, benzophenone, and N-acetyl-4-nitro-naphthylamine.

For the reactive monomer, it can be polymerized under the initiating action of the photoinitiator. As an example, the reactive monomer includes any one of or a combination of more than one of dipentaerythritol pentaacrylate, dipentaerythritol hexaacrylate, urethane acrylate, and ethoxylated pentaerythritol tetraacrylate.

For the additive, it can be selected from any one of or a combination of more than one of a polymerization inhibitor, a leveling agent, an antifoaming agent, and a stabilizer. By way of example, the polymerization inhibitor includes any one of hydroquinone, 2-sec-butyl-4,6-dinitrophenol, p-tert-butylcatechol or 2,5-di-tert-butylhydroquinone. The leveling agent includes any one of acrylic compound, organosilicon compound or fluorocarbon compound. The antifoaming agent includes any one of or a combination of more than one of emulsifying silicon oil, higher alcohol fatty acid ester complex, polyoxyethylene polyoxypropylene pentaerythritol ether, polyoxyethylene polyoxypropylene ether, polyoxypropylene glyceryl ether, polyoxypropylene polyoxyethylene glyceryl ether, and polydimethylsiloxane. The stabilizer includes any one of or a combination of more than one of isoamyl alcohol, n-hexanol, glycerol and n-hexane.

The above balance of the solvent can include organic solvent which provides a desired reaction environment for the polymerization reaction. For example, the organic solvent can be selected from any one of or a combination of more than one of N-methylpyrrolidone, glycol ether, ethylene glycol alkyl ether acetate, diethylene glycol, propylene glycol monomethyl ether acetate, ethyl ethoxyacetate, dimethoxyacetaldehyde, propylene glycol methyl ether acetate, ethyl 3-ethoxypropionate, ethoxypropionate, propylene glycol monomet ether (PM), and ethylene glycol ethyl ether acetate.

For the lyophilic magnetic nanoparticles, they are used to impart lyophilicity to the lower portion of the pixel defining layer, and they are magnetic so as to migrate to the lower portion of the pixel defining layer under the action of an external magnetic field during preparation, and they are lyophilic. In the embodiments of the present disclosure, the lyophilic magnetic nanoparticles include: magnetic nanoparticles, a coupling agent coated on the outside of the magnetic nanoparticles, and a lyophilic polymer grafted onto the surface of the coupling agent.

Wherein, the magnetic nanoparticles are used to provide magnetic properties, the lyophilic polymer is used to impart lyophilicity, and the coupling agent is used to stably bind the magnetic nanoparticles and the lyophilic polymer.

Considering that the magnetic nanoparticles should have good compatibility with the lyophobic film-forming polymer, for example, the magnetic nanoparticles include ferroferric oxide nanoparticles as magnetic inner cores. The coupling agent includes silicon dioxide, and the coupling agent acts as an intermediate layer to protect the magnetic inner cores. The lyophilic polymer includes poly(methyl methacrylate) (abbreviated as PMMA)-ethylene glycol methyl ether methacrylate (abbreviated as: EGMEMA), and the lyophilic polymer is a block copolymer. The chemical structural formula of the lyophilic magnetic nanoparticles is as follows.

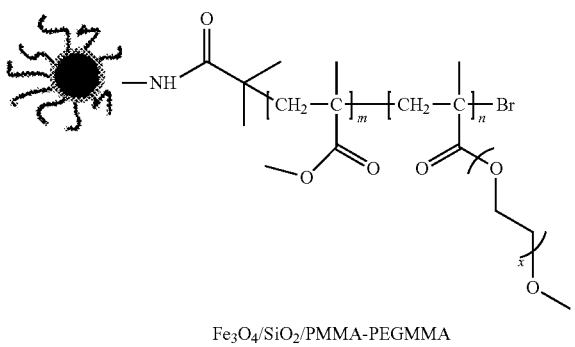

Fe$_3$O$_4$/SiO$_2$/PMMA-PEGMMA

Wherein, m is an integer with a value range of 20-100. n is an integer with a value range of 20-100. x is an integer with a value range of 2-6. By way of example, m=50, n=50, and x=4.

For the lyophilic magnetic nanoparticles having the above structure, FIG. 1 shows a flow chart of preparation of the lyophilic magnetic nanoparticles, in combination with FIG. 1, the lyophilic magnetic nanoparticles can be prepared by the following methods.

In one possible implementation, 1 g of Fe$_3$O$_4$ magnetic nanoparticles (commercially available, with a particle size of 5 nm) and 0.1 g of a silane coupling agent (γ-glycidoxypropyltrimethoxysilane, abbreviated as KH560) are stirred in a mixed solvent (20 ml) of water (H$_2$O) and ethanol (CH$_3$CH$_2$OH) at 80° C. for 2 hours to prepare Fe$_3$O$_4$/SiO$_2$ nanoparticles with a thin layer of SiO$_2$ adhered on the surface thereof. Then, 5 mL of ammonia water (NH$_3$H$_2$O) and 0.5 g of ethyl silicate (abbreviated as TEOS) are added to the above reaction system, and reacted at room temperature for 12 hours, filtered, washed with ethanol, washed with pure water, and dried to prepare magnetic Fe$_3$O$_4$/SiO$_2$ particles (i.e., Fe$_3$O$_4$ nanoparticles with SiO$_2$ adhered on the surface thereof).

The magnetic Fe$_3$O$_4$/SiO$_2$ particles prepared above are added to a toluene solution (20 mL) containing 10% by mass concentration of (3-aminopropyl) triethoxysilane (abbreviated as APTES), refluxed in nitrogen at 120° C. for 12 hours, cooled, centrifuged and the precipitate is collected. The precipitate is dispersed with 50 mL of ethanol, and then centrifuged, the precipitate after centrifuging is collected, and these steps are repeated three times. Then the precipitation last obtained is dried to obtain Fe$_3$O$_4$/SiO$_2$—NH$_2$ particles. The Fe$_3$O$_4$/SiO$_2$—NH$_2$ particles are added to 20 mL of dichloromethane (CH$_2$CL$_2$), 0.2 mL of triethylamine (abbreviated as TEA) is then added, this system is cooled to 0° C. in an ice bath, and 0.18 mL of bromoisobutyryl bromide

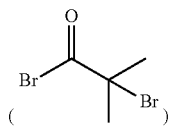

is added dropwise slowly, and the reaction is performed in an ice bath for 2 h and is continued at room temperature for 24 h, the resultant solution is filtered, washed with ethanol, washed with pure water, and dried to obtain Fe$_3$O$_4$/SiO$_2$—Br particles.

The Fe$_3$O$_4$/SiO$_2$—Br particles are added to 5 mL of cyclohexanone to disperse, and then nitrogen is charged to replacement air of the reaction system formed by the Fe$_3$O$_4$/SiO$_2$—Br particles and the cyclohexanone, 0.2 g of methyl methacrylate (abbreviated as MMA), 70 mg of bipyridine (abbreviated as Bpy) and 20 mg of copper bromide (CuBr) are added under the nitrogen atmosphere, are reacted under the nitrogen atmosphere at 90° C. for 12 h, cooled, centrifuged and the precipitate is collected. The precipitate is dispersed with 50 mL of tetrahydrofuran, and then centrifuged, the precipitate after centrifuging is collected, and these steps are repeated three times. Then the precipitation last obtained is dried to obtain Fe$_3$O$_4$/SiO$_2$/PMMA particles.

The Fe$_3$O$_4$/SiO$_2$/PMMA particles are added to 5 mL of cyclohexanone to disperse, and then nitrogen is charged to replacement air of the reaction system formed by the Fe$_3$O$_4$/SiO$_2$/PMMA particles and the cyclohexanone, 0.5 g of ethylene glycol methyl ether methacrylate (abbreviated as EGMEMA), 70 mg of bipyridyl (Bpy) and 20 mg of CuBr are added under the nitrogen atmosphere, are reacted under the nitrogen atmosphere at 90° C. for 12 h, cooled, centrifuged and the precipitate is collected. The precipitate is dispersed with 50 mL of tetrahydrofuran, and then centrifuged, the precipitate after centrifuging is collected, and these steps are repeated three times. Then the precipitation last obtained is dried to obtain the final target lyophilic magnetic nanoparticles Fe$_3$O$_4$/SiO$_2$/PMMA-EGMEMA, which have been tested and the test result shows that the final target lyophilic magnetic nanoparticles have a particle size of about 10 nm.

Figure 2:
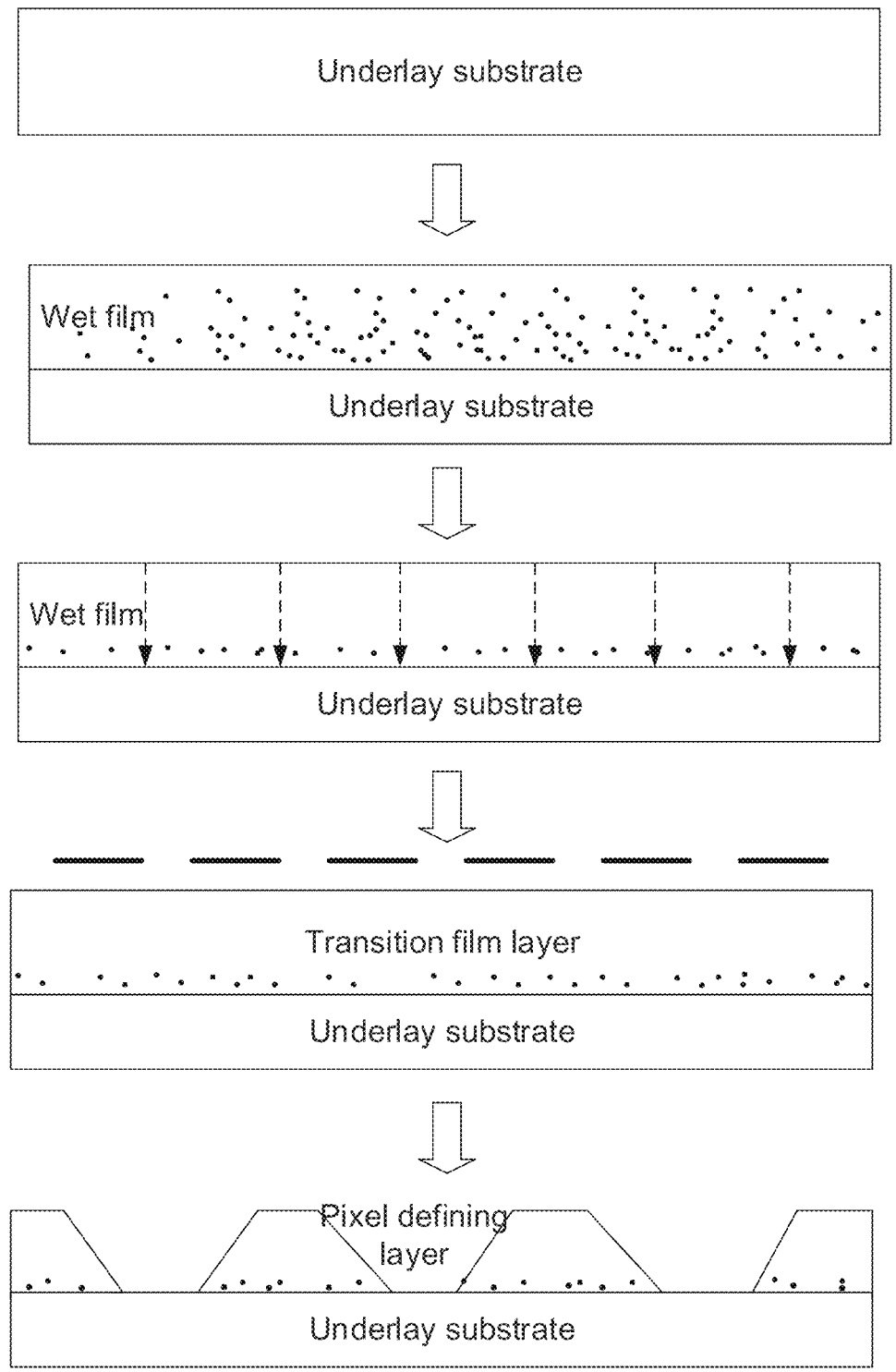
FIG. 2 is a flow chart of preparation of a pixel defining layer provided by the embodiments of the present disclosure.

In another aspect, the embodiments of the present disclosure provide a preparation method of a pixel defining layer. As shown in FIG. 2, the preparation method includes:
providing an underlay substrate;
coating the preparation material of the pixel defining layer described above on the underlay substrate to form a wet film;
removing solvent in the wet film, and inducing the lyophilic magnetic nanoparticles in the wet film to migrate toward the side close to the underlay substrate by an external magnetic field to obtain a transition film layer; and
patterning the transition film layer to obtain the pixel defining layer.

During the preparation process of the pixel defining layer, the lyophilic magnetic nanoparticles are induced to migrate toward the side close to the underlay substrate by an external magnetic field, enabling the lyophilic magnetic nanoparticles to finally distribute in the lower portion of the pixel defining layer, which imparts lyophilicity to the lower portion of the pixel defining layer, and can ensure that the pixel material solution does not spread on the top of the pixel region to contaminate adjacent pixels, and the pixel material solution is uniformly spread inside the pixel region.

In a possible implementation, the preparation material of the pixel defining layer can be coated on the underlay substrate by means of inkjet printing. Since the preparation material of the pixel defining layer is coated on the underlay substrate to form a wet film, it is necessary to remove the solvent from the wet film. The process of drying the wet film is a process of removing the solvent. By way of example, the wet film can be treated by means of drying and decompressing to remove the solvent in the wet film. The patterning described above includes processes such as prebaking, exposing, developing and curing to form a plurality of pixel regions on the transition film layer, and finally obtaining a desired pixel defining layer.

In a possible implementation, the external magnetic field is an electromagnet located below the underlay substrate, and the electromagnet can be located directly below the underlay substrate. The electromagnet is turned on while removing the solvent in the wet film, so that the lyophilic magnetic nanoparticles can migrate toward the side close to the underlay substrate, and thus the concentration of the lyophilic magnetic nanoparticles inside the transition film layer is gradually increased from top to bottom. Subsequently, the patterning process including prebaking, exposing, developing, and curing is performed to form a regular trapezoidal pixel defining layer structure. During exposing and developing, a mask can be used.

In a possible implementation, the magnetic field strength provided by the electromagnet described above can include 0.01 (Tesla, unit: T)~0.2 T, and the time of action of the magnetic field can include 10 to 100 s.

Wherein, the distribution of the lyophilic magnetic nanoparticles in the pixel defining layer is controlled by adjusting at least one of the following operating conditions: the magnetic field strength of the external magnetic field, the time of action of the external magnetic field, or the mass concentration of the lyophilic magnetic nanoparticles.

By controlling the content distribution of the lyophilic magnetic nanoparticles inside the pixel defining layer body, different lyophilicity or lyophobicity can be presented on the different positions of the pixel defining layer body. In order to achieve the desired distribution of the lyophilic magnetic nanoparticles in the pixel defining layer body, a preliminary orthogonal test can be performed before preparation. By way of example, an experimental pixel defining layer body can be provided in which the lyophilic magnetic nanoparticles are distributed. In the process of the orthogonal test, the above three factors of the magnetic field strength of the external magnetic field, the time of action of the external magnetic field, and the mass concentration of the lyophilic magnetic nanoparticles are used as experimental conditions. In the case where one of the experimental conditions is determined, the distribution of the lyophilic magnetic nanoparticles in the pixel defining layer body is changed by changing the remaining two experimental conditions; or in the case where two of the experimental conditions are determined, the distribution of the lyophilic magnetic nanoparticles in the pixel defining layer body is changed by changing the remaining one experimental condition.

Wherein, the length of the distribution of the lyophilic magnetic nanoparticles distributed in the pixel defining layer can be equal to the thickness of the pixel layer.

In one possible example, it is desirable that the lower half of the pixel defining layer is lyophilic, and the upper half of the pixel defining layer is lyophobic.

In another possible example, it is desirable that the lower portion of the pixel defining layer at a height of ⅓ from the bottom portion is lyophilic, with the remainder being lyophobic.

In another aspect, the embodiments of the present disclosure further provide a pixel defining layer prepared according to the preparation method of the pixel defining layer described above by using the preparation material described above.

Wherein, the pixel defining layer includes: a defining layer body, and lyophilic magnetic nanoparticles doped in the lower portion of the defining layer body. Wherein, the defining layer body is prepared by polymerizing a lyophobic film-forming polymer and a reactive monomer in a solvent under the action of a photoinitiator, and is doped with an additive, and the additive is uniformly distributed in the defining layer body.

It can be understood that the defining layer body has a plurality of opening regions as pixel region.

With respect to the pixel defining layer provided by the embodiments of the present disclosure, a pixel material solution is filled into the pixel region, for example, by means of inkjet printing, and then is cured. Since the pixel defining layer gradiently changes from the top portion being lyophobic to the bottom portion being lyophilic, on the one hand, the pixel material solution can be effectively avoided spreading on the top of the pixel region to contaminate adjacent pixel, and on the other hand, the pixel material solution can uniformly spread on the bottom of the pixel region, which improves film-forming uniformity to form a pixel layer having a uniform thickness.

In a further aspect, the embodiments of the present disclosure further provide a display substrate, the display substrate includes: an underlay substrate, and further includes a pixel defining layer disposed on the underlay substrate, and a pixel layer disposed in the pixel region defined by the pixel defining layer.

Based on the use of the above-described pixel defining layer, when a pixel layer is formed in the pixel region, it is easier to obtain a pixel layer having a uniform thickness and not affecting each other, thereby enabling the display substrate to obtain better light-emitting performance, and then improving the display effect and product quality of the display substrate.

It can be understood by those skilled in the art that the above-mentioned underlay substrate can include: a base and a functional film layer disposed on the base. In the case of a thin film crystal light-emitting device, for example, the underlay substrate used in the thin film crystal light-emitting device can include a thin film crystal diode and an anode layer disposed on the thin film crystal diode. Or, in the case of a quantum dot light-emitting device, for example, the underlay substrate used in the quantum dot light-emitting device can include a transparent conductive electrode base, a hole transporting layer, a quantum dot light-emitting layer, an electron transporting layer, and a metal electrode; and wherein the hole transporting layer, the quantum dot light-emitting layer, the electron transporting layer, and the metal electrode are sequentially laminated on the transparent conductive electrode base.

The display substrate described above can be prepared by the following preparation method: providing an underlay substrate;

forming a pixel defining layer on the underlay substrate according to the preparation method of the pixel defining layer described above; and filling a pixel layer material solution into a pixel region defined by the pixel defining layer, and drying to obtain a cured pixel layer which acts as the display substrate.

The foregoing descriptions are intended for the convenience of understanding the technical solutions in the present disclosure for persons in the art, and are not intended to limit the present disclosure. Within the spirit and principles of the disclosure, any modifications, equivalent substitutions, improvements, etc., are within the protection scope of the present disclosure.

What is claimed is:

1. A preparation material of a pixel defining layer, the preparation material comprising the following components in mass percentages: 5%-30% of a lyophobic film-forming polymer, 0.5%-1% of lyophilic magnetic nanoparticles, 0.5%-2% of a photoinitiator, 0.1%-1% of a reactive monomer, 0.1%-1% of an additive and a balance of solvent.

2. The preparation material of the pixel defining layer according to claim 1, wherein the lyophobic film-forming polymer comprises a copolymer of methyl methacrylate and dodecafluoroheptyl methacrylate.

3. The preparation material of the pixel defining layer according to claim 2, wherein in the copolymer of methyl methacrylate and dodecafluoroheptyl methacrylate, the mass percentage of methyl methacrylate is 85%-95%, and the balance is dodecafluoroheptyl methacrylate.

4. The preparation material of the pixel defining layer according to claim 1, wherein the photoinitiator comprises at least one of nitroaniline, anthraquinone, benzophenone, and N-acetyl-4-nitro-naphthylamine.

5. The preparation material of the pixel defining layer according to claim 1, wherein the reactive monomer comprises at least one of dipentaerythritol pentaacrylate, dipentaerythritol hexaacrylate, urethane acrylate, and ethoxylated pentaerythritol tetraacrylate.

6. The preparation material of the pixel defining layer according to claim 1, wherein the additive comprises at least one of a polymerization inhibitor, a leveling agent, an antifoaming agent, and a stabilizer.

7. The preparation material of the pixel defining layer according to claim 6, wherein the polymerization inhibitor comprises any one of hydroquinone, 2-sec-butyl-4,6-dinitrophenol, p-tert-butylcatechol and 2,5-di-tert-butylhydroquinone.

8. The preparation material of the pixel defining layer according to claim 6, wherein the leveling agent comprises any one of acrylic compound, organosilicon compound and fluorocarbon compound.

9. The preparation material of the pixel defining layer according to claim 6, wherein the antifoaming agent comprises at least one of emulsifying silicon oil, higher alcohol fatty acid ester complex, polyoxyethylene polyoxypropylene pentaerythritol ether, polyoxyethylene polyoxypropylene ether, polyoxypropylene glyceryl ether, polyoxypropylene polyoxyethylene glyceryl ether, and polydimethylsiloxane.

10. The preparation material of the pixel defining layer according to claim 6, wherein the stabilizer comprises at least one of isoamyl alcohol, n-hexanol, glycerol and n-hexane.

11. The preparation material of the pixel defining layer according to claim 1, wherein the solvent comprises at least one of N-methylpyrrolidone, glycol ether, ethylene glycol alkyl ether acetate, diethylene glycol, propylene glycol monomethyl ether acetate, ethyl ethoxyacetate, dimethoxyacetaldehyde, propylene glycol methyl ether acetate, ethyl 3-ethoxypropionate, propylene glycol monomethyl ether PM, and ethylene glycol ethyl ether acetate.

12. The preparation material of the pixel defining layer according to claim 1, wherein the lyophilic magnetic nanoparticles comprise: magnetic nanoparticles, a coupling agent coated on the outside of the magnetic nanoparticles, and a lyophilic polymer grafted onto the surface of the coupling agent.

13. The preparation material of the pixel defining layer according to claim 12, wherein the magnetic nanoparticles comprise ferroferric oxide nanoparticles;
the coupling agent comprises silicon dioxide; and
the lyophilic polymer comprises poly(methyl methacrylate-ethylene glycol methyl ether methacrylate).

14. A preparation method of a pixel defining layer, the preparation method comprising:
providing an underlay substrate;
coating the preparation material of the pixel defining layer according to claim 1 on the underlay substrate to form a wet film;
removing solvent in the wet film, and inducing the lyophilic magnetic nanoparticles in the wet film to migrate toward the side close to the underlay substrate by an external magnetic field to obtain a transition film layer; and
patterning the transition film layer to obtain the pixel defining layer.

15. The preparation method of the pixel defining layer according to claim 14, wherein the external magnetic field is an electromagnet located below the underlay substrate.

16. The preparation method of the pixel defining layer according to claim 14, wherein the distribution of the lyophilic magnetic nanoparticles in the pixel defining layer is controlled by adjusting at least one of the following operating conditions:
the magnetic field strength of the external magnetic field, the time of action of the external magnetic field, and the mass concentration of the lyophilic magnetic nanoparticles.

17. A pixel defining layer prepared by the preparation method according to claim 14.

18. The pixel defining layer according to claim 17, the pixel defining layer comprising: a defining layer body, and lyophilic magnetic nanoparticles doped in a lower portion of the defining layer body;
wherein the defining layer body is prepared by polymerizing a lyophobic film-forming polymer and a reactive monomer in a solvent under the action of a photoinitiator, and is doped with an additive.

19. A display substrate, comprising an underlay substrate, the display substrate further comprising: a pixel defining layer disposed on the underlay substrate; wherein the pixel defining layer comprises the preparation material of claim 1; and a pixel layer disposed in a pixel region defined by the pixel defining layer;
the pixel defining layer comprises: a defining layer body, and lyophilic magnetic nanoparticles doped in a lower portion of the defining layer body;
wherein the defining layer body is prepared by polymerizing a lyophobic film-forming polymer and a reactive monomer in a solvent under the action of a photoinitiator, and is doped with an additive.

20. A preparation method of a display substrate, the preparation method comprising:
providing an underlay substrate;
forming a pixel defining layer on the underlay substrate; and wherein the pixel defining layer comprises the preparation material of claim 1; and filling a pixel layer material solution into a pixel region defined by the pixel defining layer, and drying to obtain a cured pixel layer.

* * * * *